(12) United States Patent
Ahn

(10) Patent No.: US 8,023,011 B2
(45) Date of Patent: *Sep. 20, 2011

(54) CIRCUIT AND METHOD OF DETECTING SATURATION LEVEL OF IMAGE SENSOR AND IMAGE SENSOR INCLUDING SATURATION LEVEL DETECTING CIRCUIT

(75) Inventor: Jung-chak Ahn, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 12/649,895

(22) Filed: Dec. 30, 2009

(65) Prior Publication Data

US 2010/0097518 A1    Apr. 22, 2010

Related U.S. Application Data

(63) Continuation of application No. 11/608,525, filed on Dec. 8, 2006, now Pat. No. 7,652,697.

(30) Foreign Application Priority Data

Dec. 13, 2005 (KR) ................. 10-2005-0122550

(51) Int. Cl.
  H04N 9/64    (2006.01)
  H04N 3/14    (2006.01)
  H04N 5/335   (2011.01)
(52) U.S. Cl. ........................ 348/243; 348/308
(58) Field of Classification Search .......... 348/243, 348/245, 308
See application file for complete search history.

(56) References Cited

U.S. PATENT DOCUMENTS

| 6,133,563 | A  | * | 10/2000 | Clark et al. | ........... 250/208.1 |
|---|---|---|---|---|---|
| 6,831,264 | B2 | * | 12/2004 | Cazaux | ........... 250/214 R |
| 6,930,338 | B2 | * | 8/2005  | Lee | ........... 257/292 |
| 7,164,443 | B1 | * | 1/2007  | Hagihara | ........... 348/308 |
| 7,235,772 | B2 | * | 6/2007  | Ko et al. | ........... 250/208.1 |
| 7,327,393 | B2 | * | 2/2008  | Ying et al. | ........... 348/308 |
| 7,348,533 | B2 | * | 3/2008  | Ko et al. | ........... 250/208.1 |
| 7,394,492 | B2 | * | 7/2008  | Shinohara | ........... 348/301 |

(Continued)

FOREIGN PATENT DOCUMENTS

EP    1304599    4/2003

(Continued)

OTHER PUBLICATIONS

Preliminary Notice of the First Office Action dated Jul. 19, 2010 in corresponding Taiwanese Patent Appln. No. 095146588.

Primary Examiner — John Villecco
(74) Attorney, Agent, or Firm — F. Chau & Associates, LLC

(57) ABSTRACT

A circuit and method of detecting a saturation level of an image sensor including a photodiode using a black pixel circuit included in the image sensor. The saturation level detecting circuit includes a pixel unit, a reset node and a detection controller. The pixel unit includes a floating diffusion node connected to, or disconnected from, the photodiode and outputs a voltage signal corresponding to the voltage of the floating diffusion node. The reset node is connected to, or disconnected from, the floating diffusion node. The detection controller transfers a power voltage or a reference voltage to the reset node.

15 Claims, 9 Drawing Sheets

U.S. PATENT DOCUMENTS

| | | | |
|---|---|---|---|
| 7,427,790 B2 * | 9/2008 | Parks | 257/292 |
| 7,456,884 B2 * | 11/2008 | Ovsiannikov et al. | 348/308 |
| 2002/0051257 A1 * | 5/2002 | Okui et al. | 358/514 |
| 2003/0112351 A1 | 6/2003 | Clark | |
| 2004/0204639 A1 | 10/2004 | Casciani et al. | |
| 2005/0030401 A1 * | 2/2005 | Ovsiannikov et al. | 348/302 |
| 2005/0030402 A1 * | 2/2005 | Agranov et al. | 348/308 |
| 2006/0181627 A1 * | 8/2006 | Farrier | 348/308 |
| 2007/0188641 A1 * | 8/2007 | Jang | 348/308 |
| 2008/0173909 A1 * | 7/2008 | Parks | 257/292 |
| 2008/0315272 A1 * | 12/2008 | Parks | 257/292 |
| 2009/0045319 A1 * | 2/2009 | Sugawa et al. | 250/208.1 |

FOREIGN PATENT DOCUMENTS

| | | | |
|---|---|---|---|
| JP | 08340484 A | * | 12/1996 |
| JP | 2002044370 A | * | 2/2002 |
| JP | 2002369085 A | * | 12/2002 |

* cited by examiner

CIRCUIT AND METHOD OF DETECTING SATURATION LEVEL OF IMAGE SENSOR AND IMAGE SENSOR INCLUDING SATURATION LEVEL DETECTING CIRCUIT

CROSS-REFERENCE TO RELATED PATENT APPLICATION

This application is a Continuation of U.S. application Ser. No. 11/608,525 filed on Dec. 8, 2006 now U.S. Pat. No. 7,652,697, which claims priority to Korean Patent Application No. 10-2005-0122550, filed on Dec. 13, 2005, in the Korean Intellectual Property Office, the disclosure of which is incorporated herein in its entirety by reference.

BACKGROUND OF THE INVENTION

1. Technical Field

The present disclosure relates to a circuit and method of detecting a saturation level of an image sensor and an image sensor including the saturation level detecting circuit and, more particularly, to a circuit and method of detecting a saturation level of an image sensor including a photodiode using a black pixel circuit included in the image sensor.

2. Discussion of the Related Art

Image sensors used in cellular phone cameras and digital cameras include CMOS image sensors and charge-coupled device (CCD) image sensors. The image sensors capture images and output video signals corresponding to the captured images.

FIG. 1 illustrates a conventional CMOS image sensor. The CMOS image sensor includes a module lens 110 for condensing light and a semiconductor chip 120 generating a video signal corresponding to the condensed light. The chip 120 includes an image pixel region 130 including an image pixel circuit, an optical black region 140 including a black pixel circuit for removing an error caused by a voltage offset or by heat, a row driver 160 for driving pixels arranged in rows, and an analog-digital converter 150 for converting analog video signals received from pixels arranged in columns into digital video signals.

FIG. 2 illustrates the image pixel circuit 131 and the black pixel circuit 141 respectively included in the image pixel region 130 and the optical black region 140 of FIG. 1. Referring to FIG. 2, the image pixel circuit 131 and the black pixel circuit 141 essentially have the same circuit components. More specifically, each of the image pixel circuit 131 and the black pixel circuit 141 includes a photodiode PD receiving input light Lin, a transfer switch TTr receiving a transfer control signal TC, a floating diffusion node FDN, a voltage follower FTr, a select switch STr receiving a select control signal SC, and a reset switch RTr receiving a reset control signal RC. One terminal of the photodiode PD is connected to the source of a reference voltage, which is ground voltage GND in FIG. 2, and one terminal of the reset switch RTr is connected to a source of a power voltage VDD. A voltage signal Vout output from the pixel circuit 131 or 141 is input to an analog-digital converter ADC (150 of FIG. 1).

While the image pixel circuit 131 and the black pixel circuit 141 have the same configuration, the photodiode PD of the image pixel circuit 131 is exposed to light, whereas the photodiode PD of the black pixel circuit 141 is blocked from light by a light-shielding layer.

The photodiode PD of the image pixel circuit 131 generates charges caused by heat as well as charges caused by photoelectric conversion. Thus, to obtain a correct amount of charges caused by photoelectric conversion, the amount of the charges caused by heat should be subtracted from the total amount of generated charges. The photodiode PD of the black pixel circuit 141 generates only charges caused by heat, because charges caused by photoelectric conversion are not generated due to the light-shielding layer. Accordingly, the analog-digital converter ADC (150 of FIG. 1) that receives voltage signals from the image pixel circuit 131 and the black pixel circuit 141 can output a digital video signal corresponding to the amount of charges caused by photoelectric conversion by subtracting the voltage signal output from the black pixel circuit 141 from the voltage signal output from the image pixel circuit 131.

The black pixel circuit 141 is included in the optical black region 140 to remove any error caused by heat and to eliminate the effect of an offset existing in the photodiode PD of the image pixel circuit 131 and the photodiode PD of the black pixel circuit 141.

A photodiode has a saturation level that varies for wafers or chips due to manufacturing environments or other variables. Thus, image sensors have different saturation levels. Accordingly, the image sensors do not use their respective output ranges but use an output range that can be commonly applied thereto to operate stably. That is, the dynamic range of an image sensor is narrower than the actual output range in order to secure a stable operation margin of the image sensor.

Reducing the dynamic range of an image sensor, however, requires expensive devices for detecting levels that become finer in the reduced dynamic range. This is a problem different from a problem that the dynamic range become narrower because an operating voltage of the image sensor becomes lower.

SUMMARY OF THE INVENTION

Exemplary embodiments of the present invention provide a technique of detecting a correct saturation level of an image sensor.

Exemplary embodiments of the present invention also provide an image sensor having a dynamic range that is set to correspond to a detected saturation level.

According to an exemplary embodiment of the present invention, there is provided a circuit for detecting a saturation level of an image sensor including a photodiode, which includes a pixel unit, a reset node, and a detection controller. The pixel unit includes a floating diffusion node that is connected to, or disconnected from, the photodiode and outputs a voltage signal corresponding to the voltage of the floating diffusion node. The reset node is connected to, or disconnected from, the floating diffusion node. The detection controller transfers a power voltage or a reference voltage to the reset node.

The detection controller includes a first reset switch connecting/disconnecting the reset node to/from the floating diffusion node, a second reset switch transferring the power voltage to the reset node, and a reference voltage switch transferring the reference voltage to the reset node.

The pixel unit includes the photodiode, a transfer switch connecting/disconnecting the photodiode to/from the floating diffusion node, a voltage follower outputting a voltage corresponding to the voltage of the floating diffusion node, and a select switch transferring the voltage output from the voltage follower to an output terminal of the pixel unit in response to a select control signal.

According to an exemplary embodiment of the present invention, there is provided a method of detecting a saturation level of an image sensor including a photodiode using a black pixel circuit that includes a floating diffusion node connected to, or disconnected from, the photodiode, a reset node connected to, or disconnected from, the floating diffusion node, and a detection controller transferring a power voltage or a reference voltage to the reset node and that outputs a voltage signal corresponding to the voltage of the floating diffusion node, comprising the steps of: transferring the reference voltage to the photodiode via the reset node and the floating diffusion node to saturate the photodiode; transferring the power voltage to the floating diffusion node via the reset node to reset the floating diffusion node; outputting a voltage signal having a reset level corresponding to the voltage of the reset floating diffusion node; connecting the saturated photodiode to the reset floating diffusion node to saturate the floating diffusion node; and outputting a voltage signal having a saturation level corresponding to the voltage of the saturated floating diffusion node.

The voltage signal having the reset level is compared to the voltage signal having the saturation level to detect the saturation level of the image sensor.

According to an exemplary embodiment of the present invention, there is provided an image sensor including an image pixel circuit, a black pixel circuit, an analog-digital converter, and a level setting circuit. The image pixel circuit outputs a voltage signal corresponding to light input thereto. The black pixel circuit includes a floating diffusion node connected to, or disconnected from, a photodiode, a reset node connected to, or disconnected from, the floating diffusion node, and a detection controller transferring a power voltage or a reference voltage to the reset node and outputs a voltage signal corresponding to the voltage of the floating diffusion node. The analog-digital converter subtracts the voltage signal output from the black pixel circuit from the voltage signal output from the image pixel circuit and outputs a digital video signal corresponding to the subtracted result. The level setting circuit receives a voltage signal having a reset level and a voltage signal having a saturation level from the black pixel circuit and sets minimum and maximum output levels of the analog-digital converter.

The saturation level detecting circuit or the black pixel circuit is included in an optical black region of the image sensor.

The reference voltage can be a ground voltage.

According to exemplary embodiments of the present invention, saturation levels of image sensors can be correctly detected. Furthermore, dynamic ranges of the image sensors are set to correspond to the detected saturation levels, and thus the dynamic ranges of the image sensors do not become narrower than actual output ranges.

BRIEF DESCRIPTION OF THE DRAWINGS

Exemplary embodiments of the present invention will be understood in more detail from the following descriptions taken in conjunction with the attached drawings in which.

DETAILED DESCRIPTION OF EXEMPLARY EMBODIMENTS

Figure 1:
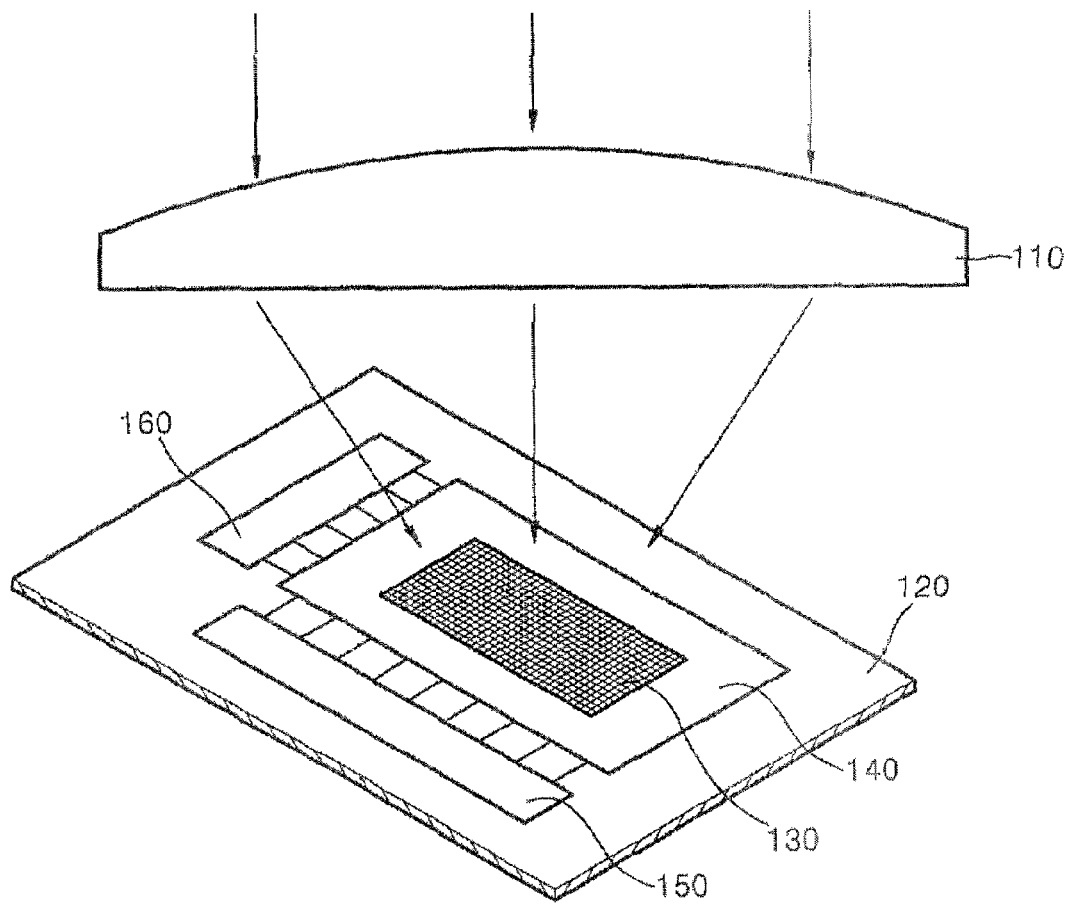
FIG. 1 illustrates a conventional CMOS image sensor.

The present invention will now be described more fully with reference to the accompanying drawings, in which exemplary embodiments of the invention are shown. The invention may, however, be embodied in many different forms and should not be construed as being limited to the exemplary embodiments set forth herein; rather, these exemplary embodiments are provided so that this disclosure will be thorough and complete, and will fully convey the concept of the invention to those skilled in the art. Throughout the drawings, like reference numerals refer to like elements.

Figure 3:
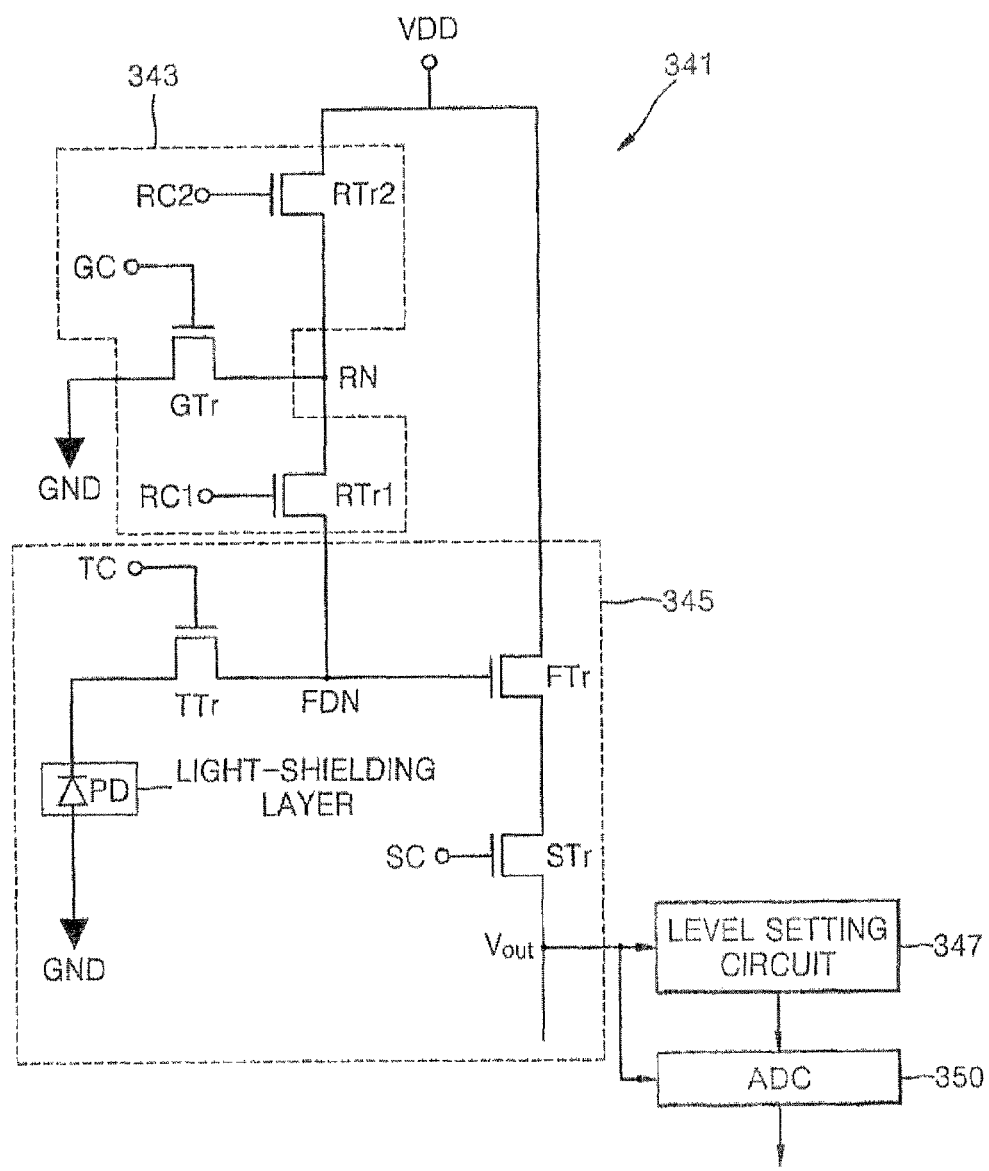
FIG. 3 is a block diagram of a circuit of detecting a saturation level of an image sensor according to an exemplary embodiment of the present invention.

A case where a saturation level detecting circuit according to exemplary embodiments of the present invention is applied to a CMOS image sensor will now be explained. FIG. 3 is a block diagram of a circuit 341 for detecting a saturation level of an image sensor according to an exemplary embodiment of the present invention. Referring to FIG. 3, the saturation level detecting circuit 341 is included in an optical black region of the image sensor. That is, the saturation level detecting circuit 341 corresponds to a black pixel circuit of the image sensor.

The saturation level detecting circuit 341 includes a detection controller 343, a reset node RN and a pixel unit 345. FIG. 3 also illustrates a level setting circuit 347 and an analog-digital converter ADC 350, in addition to the saturation level detecting circuit 341.

The detection controller 343 includes a first reset switch RTr1 receiving a first reset control signal RC1, a second reset switch RTr2 receiving a second reset control signal RC2, and a reference voltage switch GTr receiving a reference voltage switch control signal GC. The pixel unit 345 includes a photodiode PD blocked from light by a light-shielding layer, a floating diffusion node FDN, a transfer switch TTr receiving a transfer control signal TC, a voltage follower FTr, and a select switch STr receiving a select control signal SC.

A voltage signal Vout output from the pixel unit 345 is input to the level setting circuit 347 and the analog-digital converter 350. The level setting circuit 347 and the analog-digital converter 350 will be explained in detail hereinbelow with reference to FIG. 7.

A reference voltage can be set to a ground voltage GND in this embodiment. The detection controller 343 transfers a power voltage VDD or the reference voltage GND to the reset node RN. The first reset switch RTr1, which connects/disconnects the reset node RN to/from the floating diffusion node FDN, includes a first terminal connected to the reset node RN, a second terminal connected to the floating diffusion node FDN, and a control terminal receiving the first reset control signal RC1.

The second reset switch RTr2 that transfers the power voltage VDD to the reset node RN includes a first terminal connected to the source of the power voltage VDD, a second terminal connected to the reset node RN, and a control terminal receiving the second reset control signal RC2. The reference voltage switch GTr that transfers the reference voltage GND to the reset node RN includes a first terminal connected to the source of the reference voltage GND, a second terminal connected to the reset node RN, and a control terminal receiving the reference voltage switch control signal GC.

The pixel unit 345 outputs a voltage signal corresponding to the voltage of the floating diffusion node FDN. The transfer switch TTr, which connects/disconnects the photodiode PD to/from the floating diffusion node FDN, includes a first terminal connected to the photodiode PD, a second terminal connected to the floating diffusion node FDN, and a control terminal receiving the transfer control signal TC. The voltage follower FTr, which outputs a voltage corresponding to the voltage of the floating diffusion node FDN, includes a first terminal connected to the source of the power voltage VDD, a second terminal connected to the select switch STr, and a control terminal receiving the voltage of the floating diffusion node FDN. The voltage follower FTr can be a source follower that outputs a voltage corresponding to the voltage of the gate thereof.

The select switch STr, which transfers the voltage output from the voltage follower FTr to an output terminal of the pixel unit 345 in response to the select control signal SC, includes a first terminal connected to the voltage follower FTr, a second terminal connected to the output terminal of the pixel unit 345, and a control terminal receiving the select control signal SC.

While the switches TTr, STr, RTr1, RTr2 and GTr and the voltage follower FTr are MOSFETS in FIG. 3, the present invention is not limited thereto.

The operation of the saturation level detecting circuit 341 of FIG. 3 will now be explained with reference to FIGS. 4 and 5.

Figure 4:
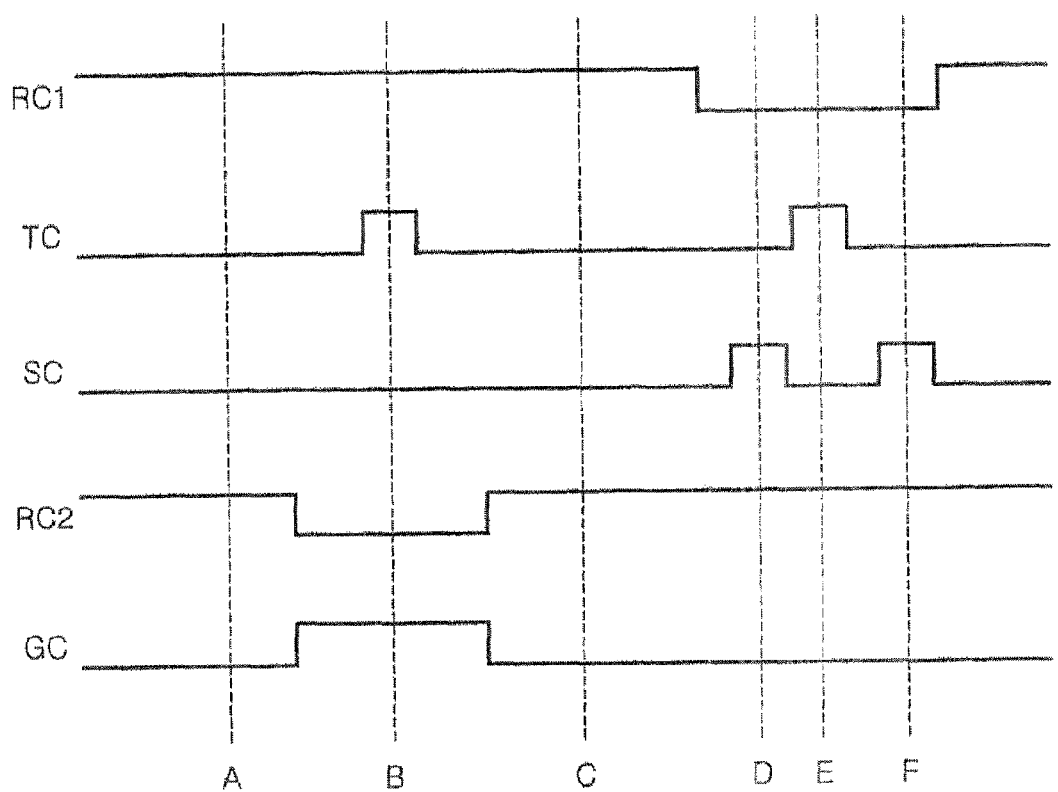
FIG. 4 is a timing diagram for explaining a method of driving the circuit of FIG. 3.

FIG. 4 is a timing diagram for explaining a method of driving the saturation level detecting circuit of FIG. 3. FIG. 4 illustrates waveforms of the reference voltage switch control signal GC, the second reset control signal RC2, the select control signal SC, the transfer control signal TC and the first reset control signal RC1 at different times A, B, C, D, E and F.

FIGS. 5A through 5F illustrate potential levels of nodes and channel regions of the circuit of FIG. 3. Specifically, potential levels of the reference voltage GND, the photodiode region PD, a channel region CH_TTr of the transfer switch TTr, the floating diffusion node region FDN, a channel region CH_RTr1 of the first reset switch RTr1, and the power voltage VDD are illustrated in FIGS. 5A through 5F.

Referring to FIGS. 4 and 5A through 5F, the potential level of the channel region CH_TTr of the transfer switch TTr is changed in response to the logic level of the transfer control signal TC, and the potential level of the channel region CH_RTr1 of the first reset switch RTr1 is changed in response to the logic level of the first reset control signal RC1.

Figure 5A:
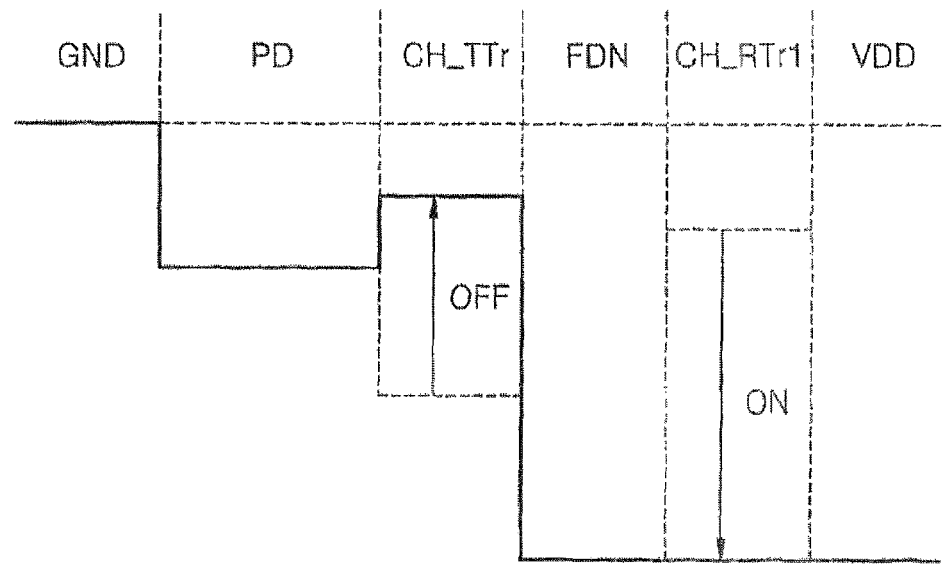
FIGS. 5A through 5F illustrate potential levels of nodes and channel regions of the circuit of FIG. 3.

In the period A shown in FIG. 5A, the first and second reset switches RTr1 and RTr2 are turned on and the reference voltage switch GTr and the transfer switch TTr are turned off. The period A corresponds to an image sensor initialization period.

Figure 5B:
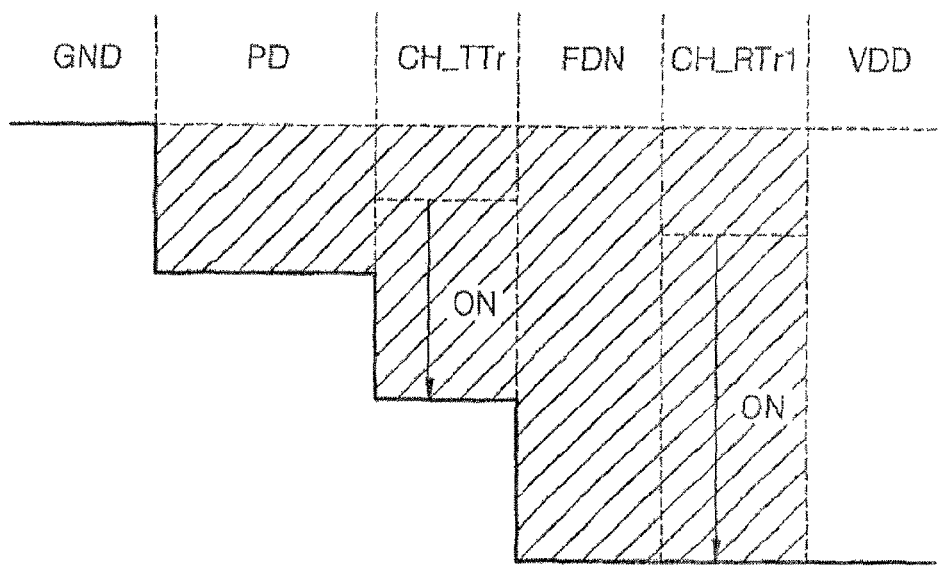

In the period B shown in FIG. 5B, the reference voltage switch GTr, the first reset switch RTr1 and the transfer switch TTr are turned on and the second reset switch RTr 2 is turned off. The reference voltage GND is transferred to the photodiode PD via the reference voltage switch GTr, the reset node RN, the first reset switch RTr1, the floating diffusion node FDN and the transfer switch TTr to saturate the photodiode PD. As shown in FIG. 5B, the photodiode region PD, the channel region CH_TTr of the transfer switch TTr, the floating diffusion node region FDN and the channel region CH_RTr1 of the first reset switch RTr1 have potential levels corresponding to the reference voltage GND.

Figure 5C:
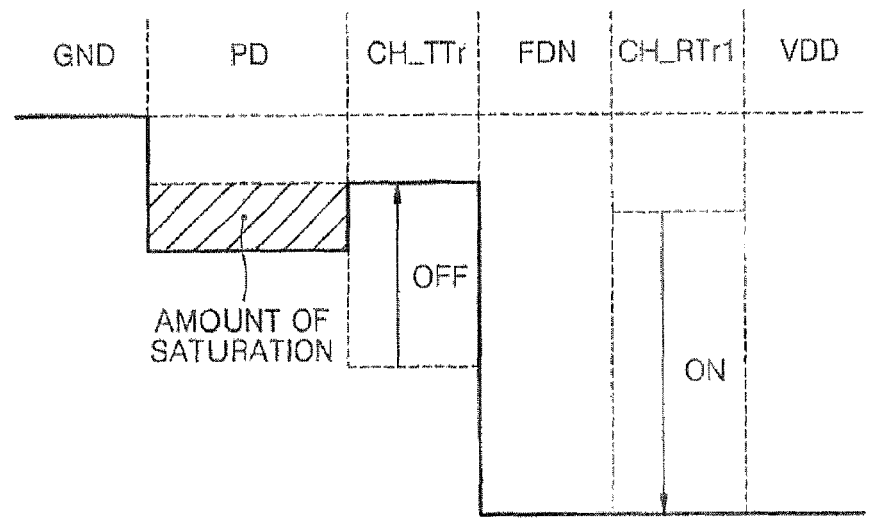

In the period C shown in FIG. 5C, the first reset switch RTr1 and the second reset switch RTr2 are turned on and the reference voltage switch GTr and the transfer switch TTr are turned off. The power voltage VDD is transferred to the floating diffusion node FDN via the second reset switch RTr2, the reset node RN and the first reset switch RTr1 to reset the floating diffusion node FDN. As shown in FIG. 5C, the floating diffusion node region FDN has a potential level corresponding to the power voltage VDD.

In the period C, an amount of charges corresponding to the deviant-line portion (the amount of saturation) is left in the photodiode region PD. When the transfer control signal TC is at a logic low level, the potential level of the channel region CH_TTr of the transfer switch TTr is higher than the potential level of the photodiode region PD. Thus, charges in the photodiode region PD cannot move to the floating diffusion region FDN but remain in the photodiode region PD, because they are blocked by a potential barrier of the channel region CH_TTr of the transfer switch TTr. The amount of saturation of the photodiode region PD is determined by the characteristic of the photodiode PD and the channel characteristic, for example, the impurity concentration of the channel region, of the transfer switch TTr.

Figure 5D:
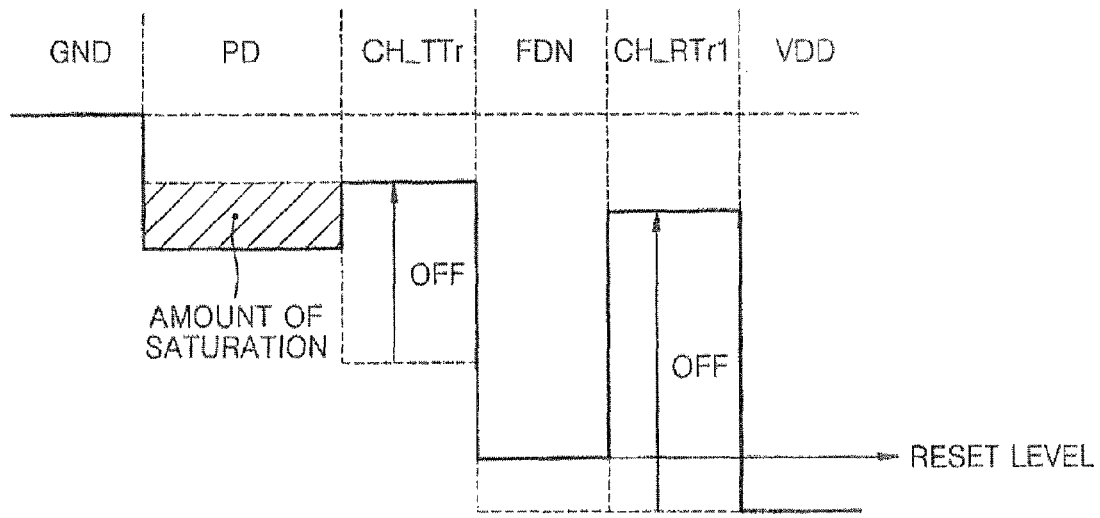

In the period D shown in FIG. 5D, the select switch STr is turned on and the first reset switch RTr1 and the transfer switch TTr are turned off. The pixel unit 345 outputs a voltage signal having a reset level corresponding to the voltage of the floating diffusion node FDN in the reset state using the voltage follower FTr and the select switch STr because the select switch STr is turned on. Referring to FIG. 5D, the potential level of the floating diffusion node FDN becomes higher than the potential level of the power voltage VDD, because the first reset switch RTr1 is turned off.

Figure 5E:
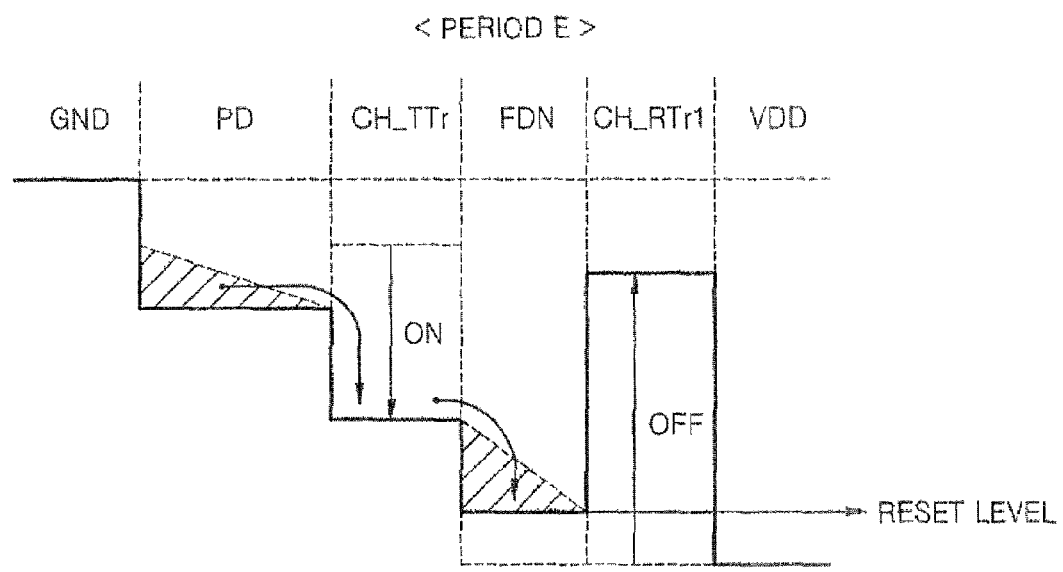

In the period E shown in FIG. 5E, the transfer switch TTr is turned on, the select switch STr is turned off, and the first reset switch RTr1 remains in the turned off state. Because the transfer switch TTr is turned on, the floating diffusion node FDN in the reset state is connected to the saturated photodiode PD, and thus the floating diffusion node FDN is gradually saturated. As shown in FIGS. 4 and 5E, the potential level of the channel region CH_TTr of the transfer switch TTr becomes lower than the potential level of the photodiode region PD when the transfer control signal TC is at a logic high level and, thus, charges (corresponding to the amount of saturation) existing in the photodiode region PD are moved to the floating diffusion region FDN.

Figure 5F:
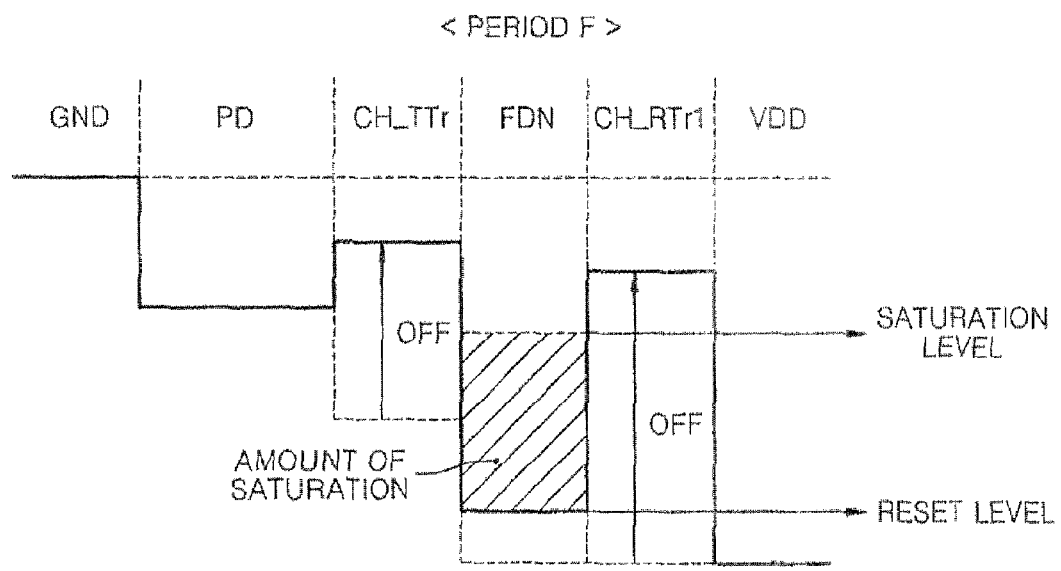

In the period F shown in FIG. 5F, the select switch STr is turned on, the transfer switch TTr is turned off, and the first reset switch RTr1 remains in the turned off state. Because the select switch STr is turned on, the pixel unit 345 outputs a voltage signal having a saturation level corresponding to the voltage of the saturated floating diffusion node FDN using the voltage follower FTR and the select switch STr. The amount of charges corresponding to a deviant-line portion (the amount of saturation) of FIG. 5F corresponds to the amount of charges corresponding to the deviant-line portion (the amount of saturation) of FIG. 5C.

A difference between the voltage of the floating diffusion node FDN when reset and the voltage of the floating diffusion node FDN when saturated corresponds to the amount of saturation shown in FIG. 5F. The pixel unit 345 outputs the voltage signal having the reset level when the floating diffusion node FDN is reset and outputs the voltage signal having the saturation level when the floating diffusion node FDN is saturated. A correct saturation level of the image sensor can be detected by comparing the voltage signal having the reset level to the voltage signal having the saturation level.

A method of detecting the saturation level of an image sensor using the black pixel circuit 341 of FIG. 1 according to an exemplary embodiment of the present invention will now be explained.

First of all, the reference voltage GND is transferred to the photodiode PD via the reset node RN and the floating diffusion node FDN to saturate the photodiode PD. This operation corresponds to FIG. 5B representing the potential levels of nodes and channel regions in the period B. Then, the power voltage VDD is transferred to the floating diffusion node FDN via the reset node RN to reset the floating diffusion node FDN. This operation corresponds to FIG. 5C representing the potential levels of nodes and channel regions in the period C.

Subsequently, a voltage signal having a reset level corresponding to the voltage of the reset floating diffusion node FDN is output. This operation corresponds to FIG. 5D representing the potential levels of nodes and channel regions in the period D. Then, the saturated photodiode PD is connected to the reset floating diffusion node FDN to saturate the floating diffusion node FDN. This operation corresponds to FIG. 5E representing the potential levels of nodes and channel regions in the period E. A voltage signal having a saturation level corresponding to the voltage of the saturated floating diffusion node FDN is output. This operation corresponds to FIG. 5F representing the potential levels of nodes and channel regions in the period F.

Through the aforementioned process, the voltage signal having the reset level and the voltage signal having the saturation level are detected and compared to each other to detect a correct saturation level of the image sensor.

Figure 2:
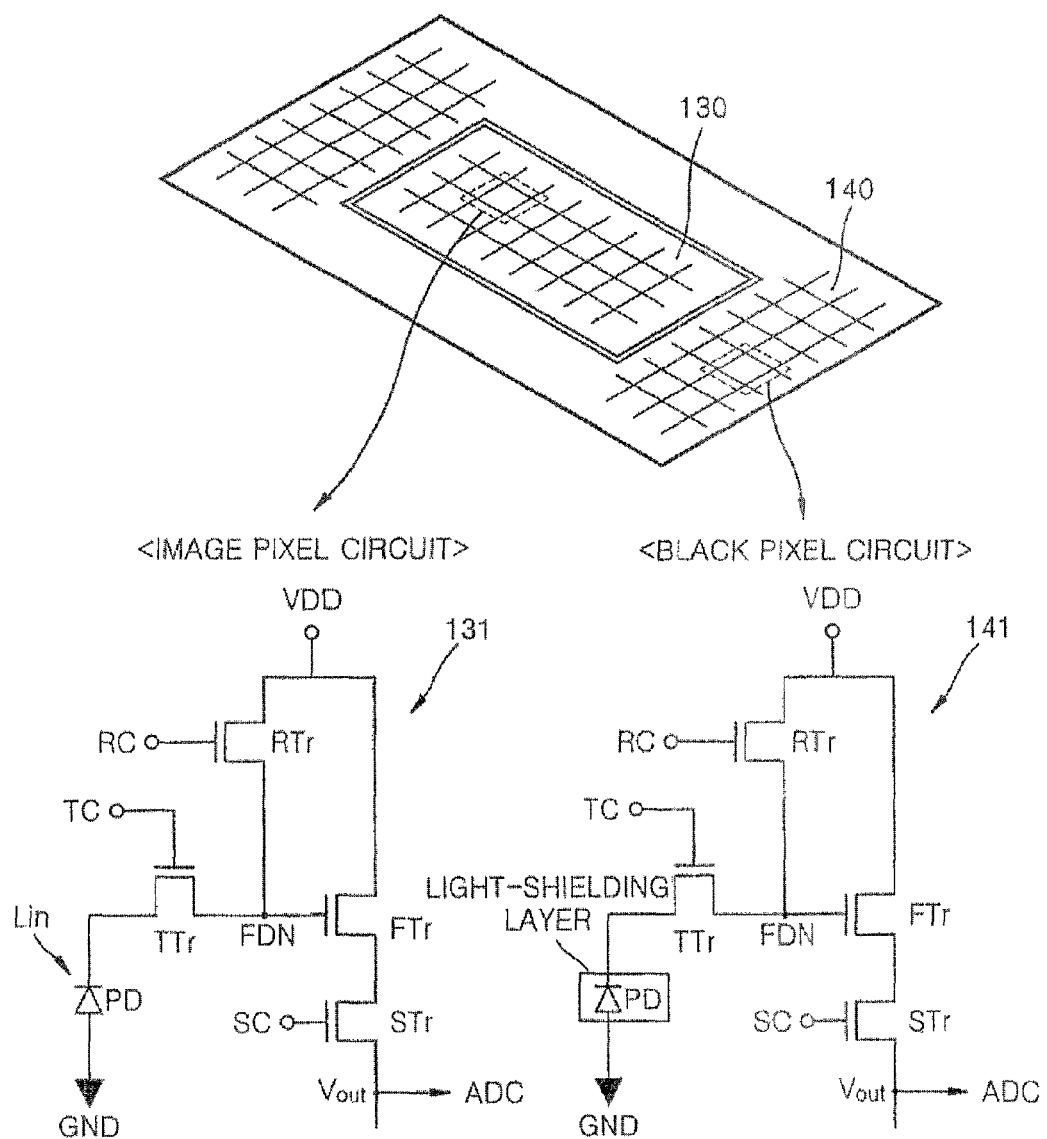
FIG. 2 illustrates an image pixel circuit and a black pixel circuit respectively included in an image pixel region and an optical black region of FIG. 1.
Figure 6:
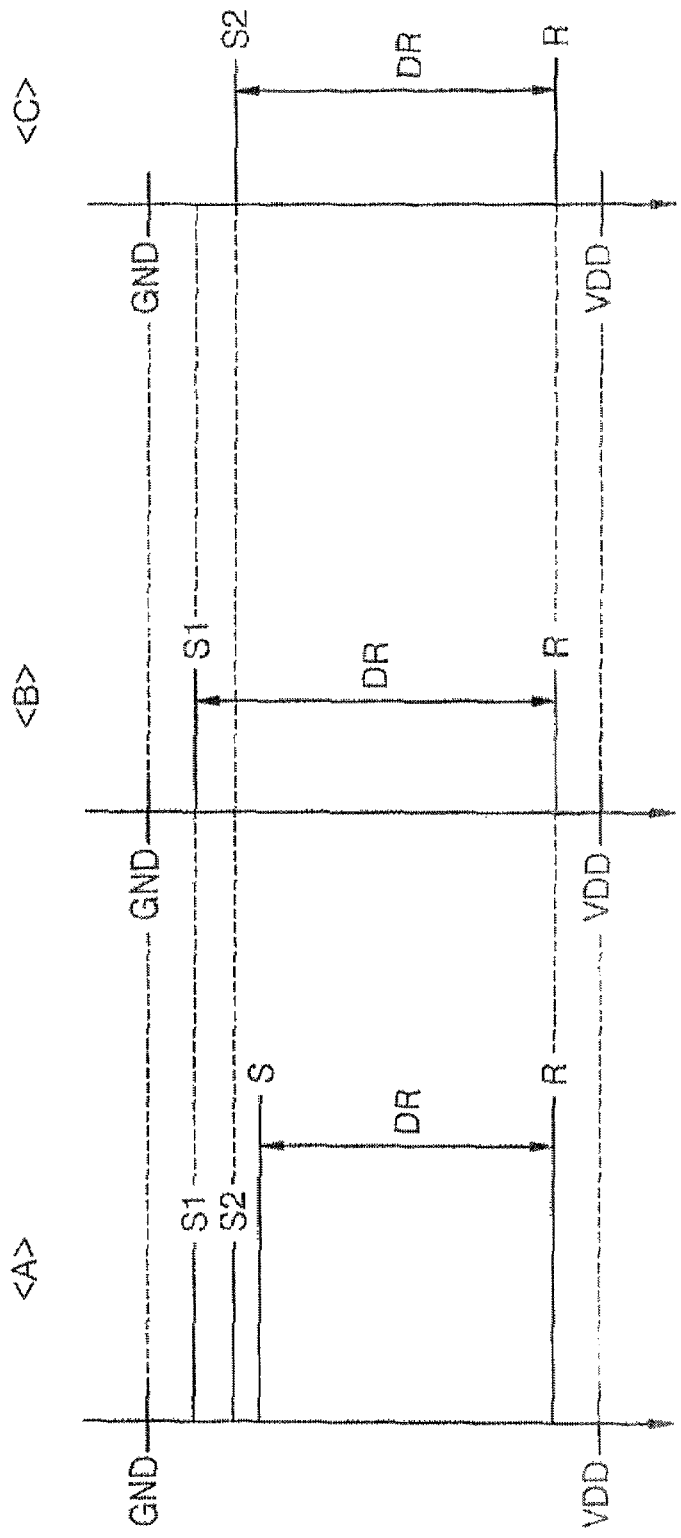
FIG. 6 is a diagram for explaining the dynamic range of an image sensor according to an exemplary embodiment of the present invention.

FIG. 6 is a diagram for explaining the dynamic range of an image sensor according to an exemplary embodiment of the present invention. FIG. 6 <A> explains the dynamic range DR of the image sensor of FIG. 2, and FIGS. 6 <B> and <C> explain the dynamic range DR of the image sensor according to an exemplary embodiment of the present invention.

Consider two image sensors (first and second image sensors) having different saturation levels. In FIG. 6, S1 represents the saturation level of the first image sensor and S2 represents the saturation level of the second image sensor. As shown in FIG. 6 <A>, the dynamic range DR of the image sensor of FIG. 2 corresponds to a difference between a reset level R and a set saturation level S. The set saturation level S means a saturation level that can be commonly applied to the first and second image sensors in consideration of the fact that the first and second image sensors have different saturation levels. For stable operation, image sensors, such as the image sensor of FIG. 2, do not use their respective output ranges but use an output range that can be commonly applied thereto. This decreases the dynamic ranges of the image sensors. That is, the dynamic range DR of an image sensor becomes narrower than the actual output range in order to secure a stable operation margin of the image sensor.

Referring to FIG. 6 <B> and FIG. <C>, the dynamic range DR of the image sensor according to an exemplary embodiment of the present invention corresponds to a difference between the reset level R and the actual saturation level S1 or S2. An exemplary embodiment of the present invention detects the saturation levels S1 and S2 of the first and second image sensors using the saturation level detecting circuit 341 of FIG. 3 and sets the dynamic ranges of the image sensors such that the dynamic ranges DR respectively correspond to the saturation levels. Accordingly, the dynamic ranges of the image sensors are not narrower than the actual output ranges.

Figure 7:
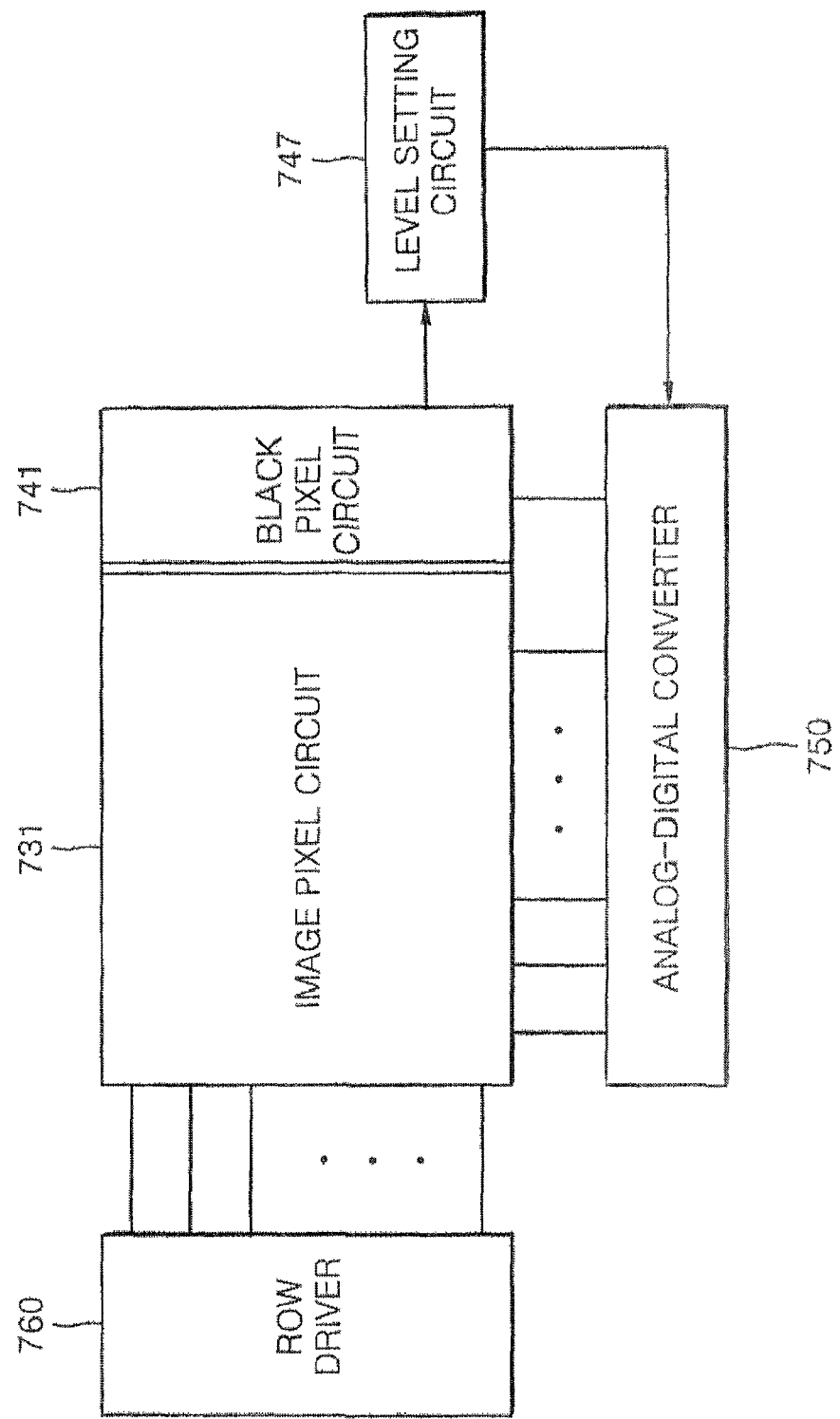
FIG. 7 is a block diagram of an image sensor according to an exemplary embodiment of the present invention.

FIG. 7 is a block diagram of an image sensor according to an exemplary embodiment of the present invention. Referring to FIG. 7, the image sensor includes an image pixel circuit 731, a black pixel circuit 741, a level setting circuit 747, an analog-digital converter 750 and a row driver 760. The row driver 760 corresponds to the row driver 160 of FIG. 1.

The image pixel circuit 731 outputs a voltage signal corresponding to the amount of light input thereto. The black pixel circuit 741 includes a floating diffusion node connected/disconnected to/from a photodiode, a reset node connected/disconnected to/from the floating diffusion node, and a detection controller transferring a power voltage VDD or a reference voltage GND to the reset node and outputting a voltage signal corresponding to the voltage of the floating diffusion node. The black pixel circuit 741 corresponds to the saturation level detecting circuit 341 of FIG. 3.

The analog-digital converter 750 subtracts the voltage signal output from the black pixel circuit 741 from the voltage signal output from the image pixel circuit 731 to remove any error caused by an offset or by heat and outputs a digital video signal corresponding to the subtracted result. The level setting circuit 747 receives a voltage signal having a reset level and a voltage signal having a saturation level from the black pixel circuit 741 and sets minimum and maximum output levels of the analog-digital converter 750. The level setting circuit 747 sets the dynamic range of the image sensor to the actual output range.

As described above, the voltage signal having the reset level corresponds to a voltage signal having the voltage of the reset floating diffusion node (refer to FIG. 5D) and the voltage signal having the saturation level corresponds to a voltage signal having the voltage of the saturated floating diffusion node (refer to FIG. 5F).

As shown in FIG. 3, the detection controller 343 can include the first reset switch RTr1 connecting/disconnecting the reset node RN to/from the floating diffusion node FDN, the second reset switch RTr2 transferring the power voltage VDD to the reset node RN, and the reference voltage switch GTr transferring the reference voltage GND to the reset node RN.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An image sensor comprising:
   a saturation level detecting circuit generating and outputting a voltage signal having a reset level and a voltage signal having a saturation level using a power voltage or a reference voltage; and
   a level setting circuit setting minimum and maximum output levels of the image sensor using the voltage signal having the reset level and the voltage signal having the saturation level.

2. The image sensor of claim 1, wherein the saturation level detecting circuit comprises:
   a pixel unit including a floating diffusion node connected to or disconnected from a photodiode and outputting the voltage signal having a reset level or a saturation level corresponding to a voltage of the floating diffusion node;
   a reset node connected to or disconnected from the floating diffusion node; and
   a detection controller transferring the power voltage or the reference voltage to the reset node.

3. The image sensor of claim 2, wherein the voltage signal having the reset level corresponds to the voltage of the floating diffusion node when the floating diffusion node is reset by the power voltage applied thereto.

4. The image sensor of claim 2, wherein the voltage signal having the saturation level corresponds to the voltage of the floating diffusion node when the photodiode, which is saturated by the reference voltage applied thereto, is connected to the floating diffusion node to saturate the floating diffusion node.

5. The image sensor of claim 2, wherein the detection controller comprises:
   a first reset switch connecting/disconnecting the reset node to/from the floating diffusion node;
   a second reset switch transferring the power voltage to the reset node; and
   a reference voltage switch transferring the reference voltage to the reset node.

6. The image sensor of claim 2, wherein the pixel unit comprises:
   the photodiode;
   a transfer switch connecting/disconnecting the photodiode to/from the floating diffusion node;
   a voltage follower outputting a voltage corresponding to the voltage of the floating diffusion node; and
   a select switch transferring the voltage output from the voltage follower to an output terminal of the pixel unit in response to a select control signal.

7. The image sensor of claim 2, wherein the photodiode is blocked from light by a light-shielding layer.

8. The image sensor of claim 1, wherein the saturation level detecting circuit is included in an optical black region of the image sensor.

9. The image sensor of claim 1, wherein the reference voltage is a ground voltage.

10. A plurality of image sensors having different saturation levels, each image sensor comprising:
   a saturation level detecting circuit generating and outputting a voltage signal having a reset level of the corresponding image sensor and a voltage signal having a saturation level of the corresponding image sensor using a power voltage or a reference voltage; and
   a level setting circuit setting a dynamic range of the corresponding image sensor using the voltage signal having the reset level and the voltage signal having the saturation level.

11. The image sensor of claim 10, wherein the dynamic range of the corresponding image sensor corresponds to a difference between the reset level of the corresponding image sensor and the saturation level of the corresponding image sensor.

12. The image sensor of claim 10, wherein the saturation level detecting circuit comprises:
   a pixel unit including a floating diffusion node connected to or disconnected from a photodiode and outputting the voltage signal having a reset level or a saturation level corresponding to a voltage of the floating diffusion node;
   a reset node connected to or disconnected from the floating diffusion node; and
   a detection controller transferring the power voltage or the reference voltage to the reset node.

13. The image sensor of claim 12, wherein the voltage signal having the reset level corresponds to the voltage of the floating diffusion node when the floating diffusion node is reset by the power voltage applied thereto.

14. The image sensor of claim 12, wherein the voltage signal having the saturation level corresponds to the voltage of the floating diffusion node when the photodiode, which is saturated by the reference voltage applied thereto, is connected to the floating diffusion node to saturate the floating diffusion node.

15. The image sensor of claim 10, wherein the saturation level detecting circuit is included in an optical black region of the image sensor.

* * * * *